United States Patent [19]
Shin

[11] Patent Number: 5,838,902
[45] Date of Patent: Nov. 17, 1998

US005838902A

[54] COPY PROTECTION CIRCUIT FOR A DATA IN A MEMORY

[75] Inventor: Jong Su Shin, Choongchungbook-Do, Rep. of Korea

[73] Assignee: LG Semicon Co., Ltd., Cheongju, Rep. of Korea

[21] Appl. No.: 965,770

[22] Filed: Nov. 7, 1997

Related U.S. Application Data

[63] Continuation-in-part of Ser. No. 429,258, Apr. 25, 1995, abandoned.

[30]     Foreign Application Priority Data

Apr. 30, 1994 [KR]   Rep. of Korea ..................... 1994/9562

[51] Int. Cl.$^6$ ..................................................... G06F 11/00
[52] U.S. Cl. .................... 395/186; 395/186; 395/187.01; 395/188.01; 395/200.59; 380/3; 380/4; 380/23
[58] Field of Search .............................. 395/186, 187.01, 395/188.01; 380/3, 4, 5, 23

[56]     References Cited
U.S. PATENT DOCUMENTS 5,446,864  8/1995  Burghardt et al. ...................... 395/427
5,499,295  3/1996  Cooper ..................................... 380/23

*Primary Examiner*—Robert W. Beausoliel, Jr.
*Assistant Examiner*—Pierre E. Elisca
*Attorney, Agent, or Firm*—Fleshner & Kim

[57]     ABSTRACT

An improved copy protection circuit of a data stored in a memory capable of advantageously protecting an illegal copying of a data stored in a memory such as a mask ROM (Read Only Memory) by storing a data in a security data store cell. The protection circuit includes a security data store circuit for storing a security data encoded in accordance with a chip enabling signal applied thereto, a switch circuit for outputting a switching signal controlled by the security data, and a data converting circuit for converting an input address by receiving the input address and the security data and for outputting the converted address or the input address to a X, Y-address buffer/decoder in accordance with an output of the switch circuit.

7 Claims, 4 Drawing Sheets

COPY PROTECTION CIRCUIT FOR A DATA IN A MEMORY

This application is a continuation-in-part of application Ser. No. 08/429,258, filed Apr. 25, 1995, now abandoned.

BACKGROUND OF THE INVENTION

1. Field of the Invention

The present invention relates to a copy protection circuit for data in a memory, and particularly to an improved copy protection circuit of data stored in a memory capable of advantageously protecting against illegal copying of data stored in a memory such as a mask ROM(Read Only Memory) by storing data in a security data store cell.

2. Description of the Conventional Art

Referring to FIG. 1, there is provided a conventional memory access circuit for reading data stored in a memory. The conventional memory access circuit includes a control circuit 1 for controlling a memory access circuit in accordance with an output enabling signal OE and a chip enabling signal CE applied thereto from externally connected elements, an X-address buffer/decoder 2 for buffering and decoding the X-address applied thereto in accordance with a control signal outputted from the control circuit and a Y-address buffer/decoder 3 for buffering and decoding the Y-address applied thereto in accordance with a control signal outputted from the control circuit 1. The circuit further includes a data store circuit 4 for outputting previously stored data in accordance with the X-address XABD outputted from the X-address buffer/decoder 2 and the Y-address YABD outputted from the Y-address buffer/decoder 3, a sense amplifying circuit 5 for amplifying the data outputted from the data store circuit 4 to a predetermined level in accordance with a control signal of the control circuit 1, and a data output buffer/driver circuit 6 for buffering and transferring the amplified data outputted from the sense amplifying circuit in accordance with a control signal of the control circuit 1.

The detailed operation of the conventional memory access circuit will now be explained.

To begin with, a user applies an X-address and a Y-address of the data store circuit 4 to the X-address buffer/decoder 2 and the Y-address buffer/decoder 3, respectively, for reading the data stored in the data store circuit 4.

Thereafter, the control circuit 1 driven by the chip enabling signal CE applies a control signal to the X-address buffer/decoder 2, the Y-address buffer/decoder 3, the sense amplifying circuit 5 and the data output buffer/driver circuit 6, respectively, in accordance with the output enabling signal OE.

The X-address buffer/decoder 2 performs buffering and decoding of the X-address applied thereto and then applies the buffered and decoded X-address XABD to the data store circuit 4.

In addition, the Y-address buffer/decoder 3 performs buffering and decoding of the Y-address applied thereto and then applies the buffered and decoded Y-address YABD to the data store circuit 4.

The data store circuit 4 selects data corresponding to the X-, Y-addresses XABD and YABD and then outputs the selected data corresponding to the X-, Y-addresses XABD and YABD to the sense amplifying circuit 5.

The sense amplifying circuit 5 amplifies the data outputted from the data store circuit 4 to a predetermined level and then applies the amplified data to the data output buffer/driver circuit 6 in accordance with a control signal outputted from the control circuit 1.

The data output buffer/driver circuit 6 transfers the data outputted from the sense amplifying circuit 5 to the output terminal OUT in accordance with a control signal outputted from the control circuit 1

However, the conventional memory access circuit has not a security circuit capable of advantageously protecting the stored data from illegal copying, so that the security data stored in the memory might illegally be copied by others.

SUMMARY OF THE INVENTION

Accordingly, it is an object of the present invention to provide a copy protection circuit for data in a memory.

It is another object of the present invention to provide an improved copy protection circuit for data in a memory.

To achieve the objects, there is provided a copy protection circuit for data in memory, which includes a security data store circuit for storing security data encoded in accordance with a chip enabling signal applied thereto; a switch circuit for outputting a switching signal controlled by the security data; and a data converting circuit for converting an input address by receiving the input address and the security data and for outputting the converted address to an X, Y-address buffer/decoder in accordance with an output of the switch circuit.

DETAILED DESCRIPTION OF THE INVENTION

Figure 1:
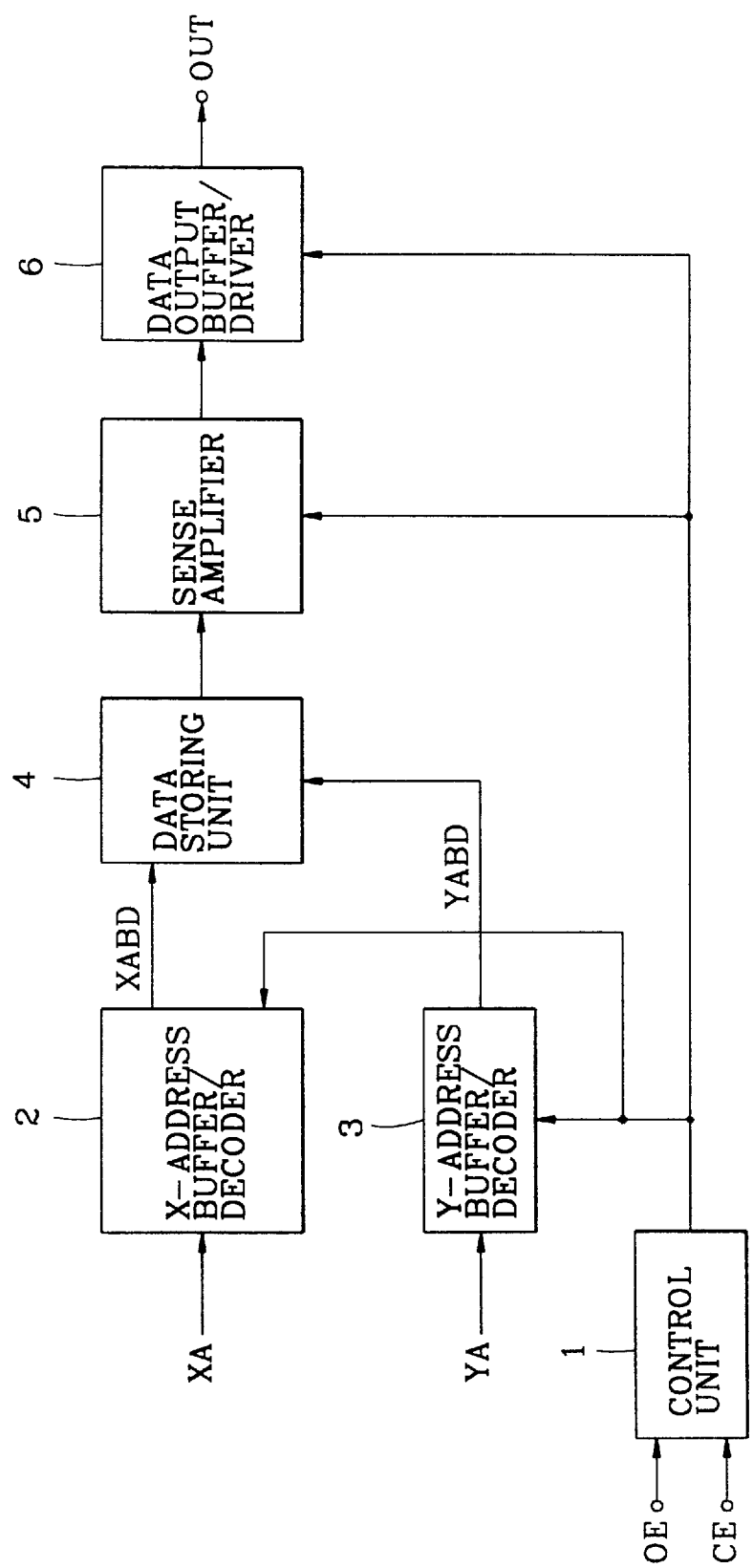
FIG. 1 is a block diagram showing a conventional memory access circuit.
Figure 2A:
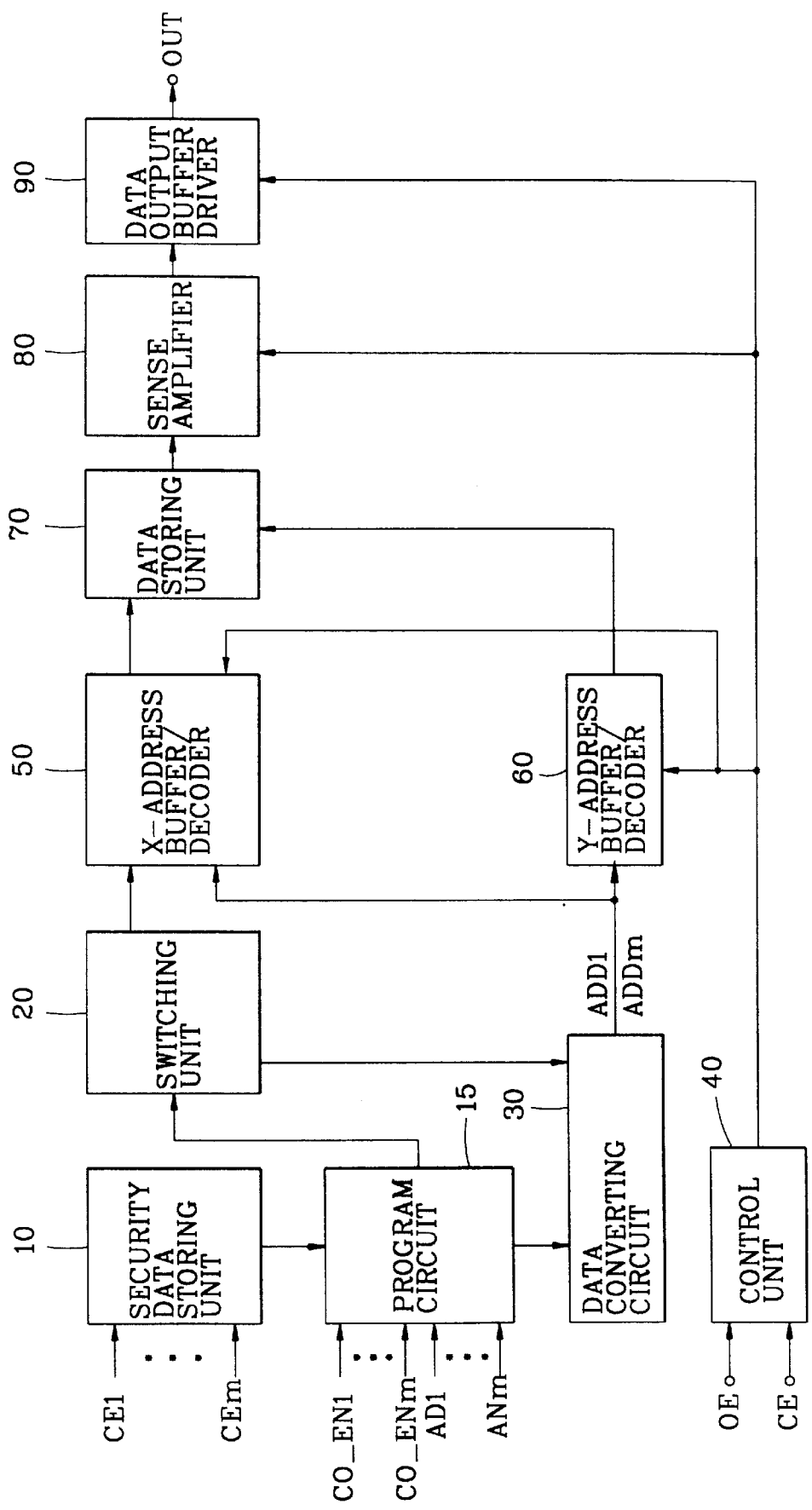
FIG. 2A is a block diagram showing a copy protection circuit for a data in a memory according to the present invention.

Referring and FIG. 2A a copy protection circuit for data in a memory according to the present invention includes a security data storing circuit 10 for storing predetermined security data in accordance with chip enabling signals CEI–CEm outputted from externally connected elements; a program circuit 15 for programming the predetermined security data a switching circuit 20 for outputting a predetermined signal in accordance with security data outputted from the security data storing circuit 10 through the program circuit 15; a data converting circuit 30 for logically combining the output signal of the program circuit 15 and the address data AD1–ADm outputted from the externally connected elements though the program circuit 15 in accordance with a signal outputted from the switching circuit 20; a control circuit 40 for outputting a control signal in accordance with an output enabling signal OE and a chip enabling signal CE, which are outputted from the externally connected elements; an X-address buffer/decoder 50 for buffering and decoding the converted address data ADD1–ADDm outputted from the data converting circuit 30 in accordance with a control signal of the control circuit 40; a Y-address buffer/decoder 60 for buffering and decoding the converted address data ADD1–ADDm outputted from the data converting circuit 30 in accordance with a control signal of the control circuit 40; a data storing circuit 70 for outputting a data corresponding to the addresses outputted from the X-, Y-address buffer decoders 50 and 60; a sense amplifying circuit 80 for amplifying the data outputted from the data storing circuit 70 to a predetermined level in accordance with a control signal outputted from the control circuit 40; and a data output buffer and driver 90 for buffering the data outputted from the sense amplifying circuit 80 in accordance with a control signal of the control circuit 40 and for transferring the buffered data to the output terminal OUT.

Figure 2B:
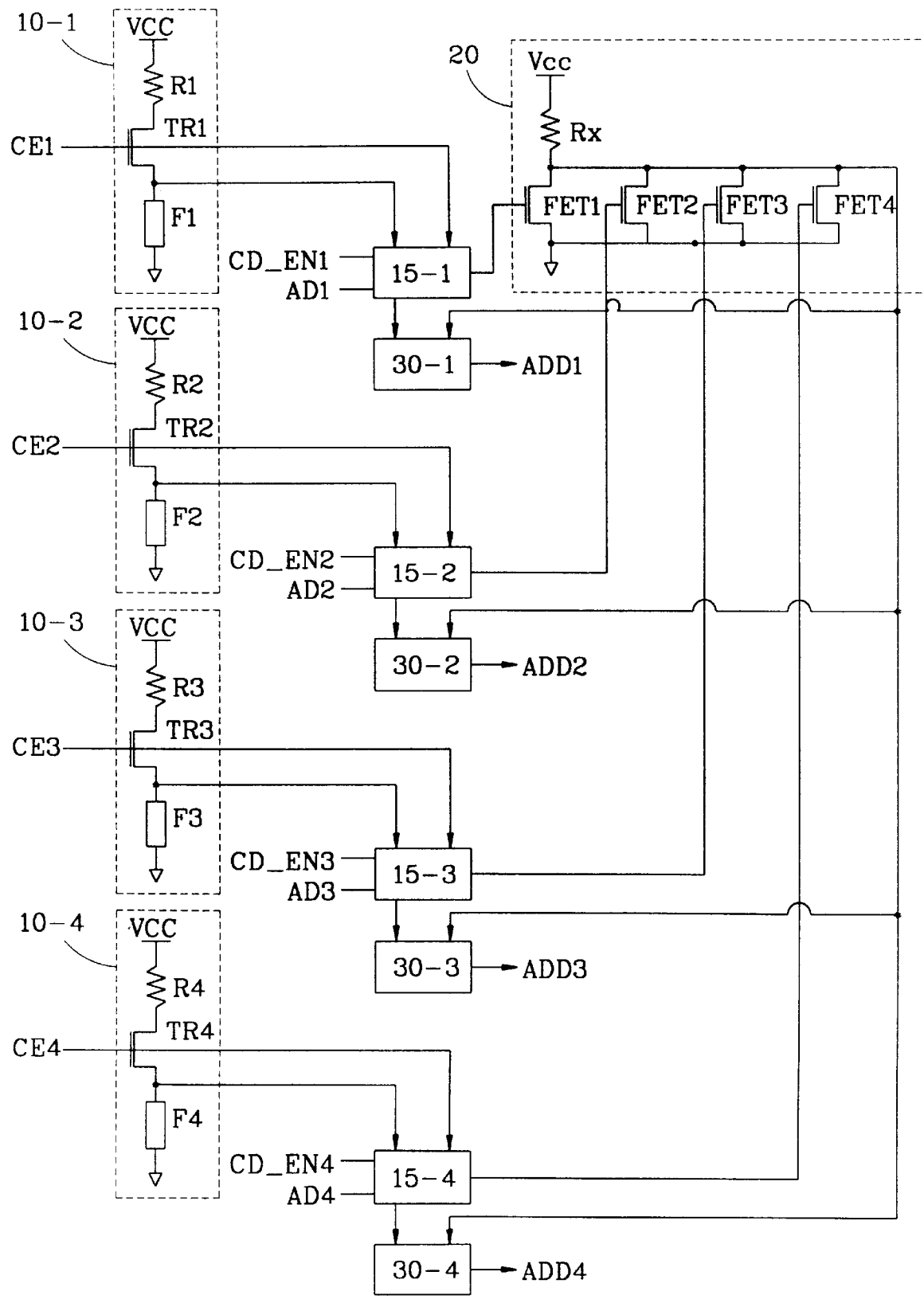
FIGS. 2B–2D are detailed block diagrams showing parts of the copy protection circuit for the data in the memory shown in FIG. 2A.
Figure 2C:
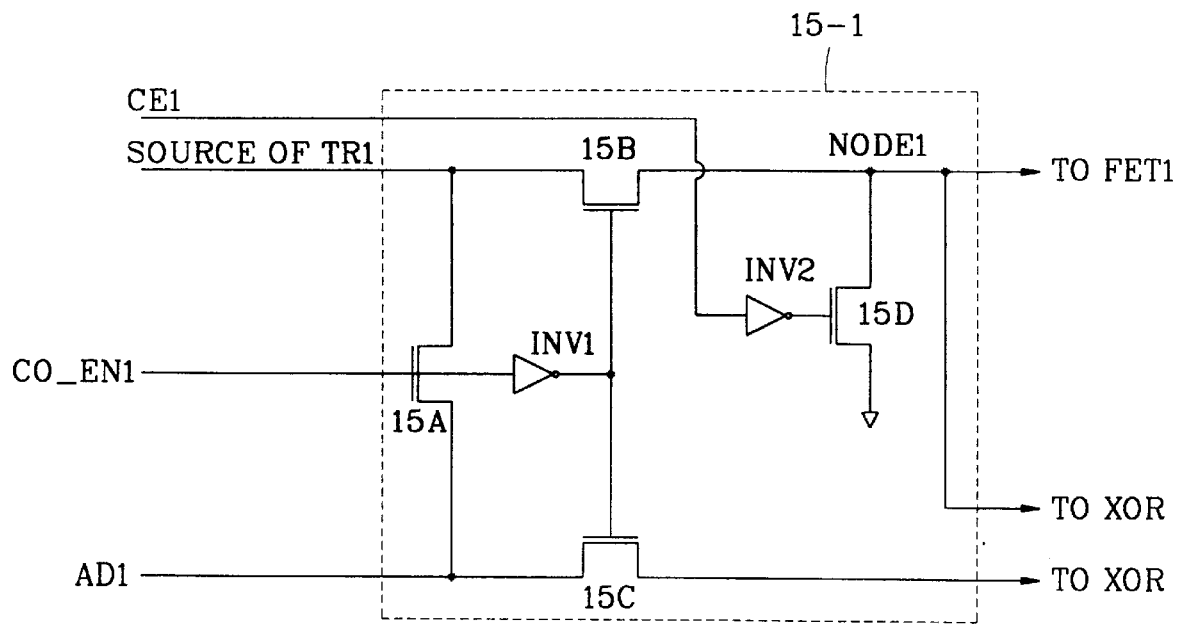
Figure 2D:
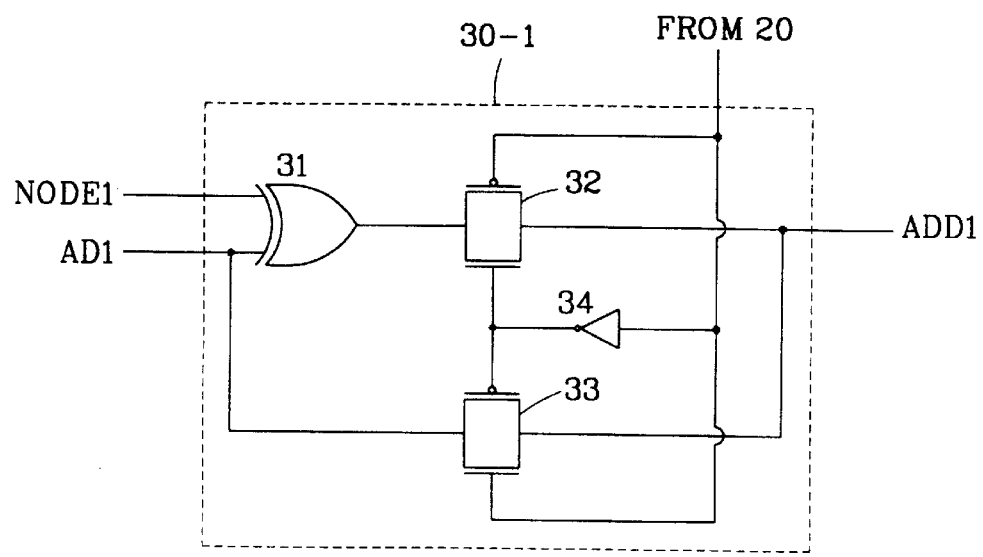

FIG. 2B illustrates a detailed schematic of the security data storing circuit 10 having memory cells 10-1 to 10-4 and the switching circuit 20 having transistors FET1 to FET4 with corresponding program circuit 15 having program units 15-1 to 15-4 and data converting circuit 30 having converting units 30-1 to 30-4 when m=4. FIGS. 2C and 2D illustrate details of the program unit 15-1 and the converting unit 30-1. The program units 15-2 to 15-4 and converting units 30-2 to 30-4 have the same construction as the program unit 15-1 and converting unit 30-1. As can be appreciated, m=4 is intended to be illustrative, and not limiting the scope of the appended claims.

The security data storing circuit 10 consists of memory cells 10-1 to 10-4 in which each of cells 10-1 to 10-4 includes a drain for receiving the voltage Vcc through a resistance R1-R4, a gate for receiving a chip enabling signal CE1-CE4 outputted from the externally connected elements, and transistors TR1-TR4 having a source grounded through a fuse F1-F4.

As shown, in FIG. 2C, the program unit 15-1 includes a transistor 15A with a gate coupled to receive a code enable signal CO_EN1, which is also applied to a first inverter INV1. The output of the inverter INV1 is applied to the gates of transistors 15B and 15C. The chip enabling signal CE1 is applied to a second inverter INV2, and the output thereof is applied to a gate of a tranistor 15D. The electrodes of transistors 15B and 15D are coupled to a node NODE1 which is coupled to the gate of the transistor FET1 of the switching circuit 20. The transistor 15D prevents the node NODE1 from floating when the chip enabling signal CE1 is disabled, i.e., CE1=LOW. Further, the signal at the node NODE1 is applied to an input of an exclusive OR-gate 31 in the converting unit 30-1. The electrodes of transistors 15A and 15B are coupled to the source of the transistor TR1 of the memory cell 10-1. The address signal AD1 is applied to the transistor 15C, and passed to another input of the exclusive OR gate 31 in the converting unit 30-1 when the transistor 15C is turned ON.

The switching circuit 20 consists of transistors FET1~FET4 for receiving an output of the memory cells program units 15-1 to 15-4 through each of gates, in which each of transistors FET1~FET4 consists of a drain for receiving the voltage Vcc through a resistance Rx and a source which is grounded.

The data converting circuit 30 consisting of converting units 30-1~30-4 for receiving addresses AD1–AD4 through an input terminal of the exclusive Or-gate 31, which logically combines the data outputted from the program units 15-1 to 15-4 of and the addresses AD1 to AD4 a first transfer gate 32 for transferring an output of the exclusive Or-gate in accordance with a signal outputted from the switching circuit 20, and a second transfer gate 33 for transferring addresses AD1~ADm through an input terminal in accordance with a signal outputted from the switching circuit 20.

The inverter 34 allows alternate activation of first and second transfer gates 32 and 33.

To store specific chip enabling signals CEI to CE4 into the memory cells 10-1 to 10-4 of the security data storing circuit 10, the fuses F1 to F4 are either cut or uncut during a coding operation. During this operation, the fuse Fm is cut by applying a low CEm signal, a high CO_ENM and a high voltage, e.g., 8V for ADm. The cutting of the fuse allows storage of a binary value "1" in a corresponding memory cell 10-m. For example, to program chip enabling signals CE1 to CE4 as "1,0,1,1", the above voltage levels are applied for memory cells 10-1, 10-3 and 10-4 to cut the fuses F1, F3 and F4 while F2 is left uncut. The above programming can be performed by the user or during a testing operation of the chip. Since the fuse can be only cut once, the chip enabling signal program is done only once.

The transistors FET1 to FET4 are turned on or off based on the chip enabling signals CE1 to CE4. If the inputted chip enabling signals CE1–CE4 do not correspond with the programmed chip enabling signals, the corresponding transistors FET1 to FET4 are turned on such that a low level signal is inputted to the converting units 30-1 to 30-4. However, if the inputted chip enabling signals CE1–CE4 correspond to the programmed chip enabling signals, the transistors FET1–FET4 are turned off such that a high level signal is applied to the converting units 30-1 to 30-4.

During regular operation, a low level code enable signals CO_EN1–CO_EN4 are applied to the program units 15-1 to 16-4. To read the data stored in the data storing unit, the user inputs the address signals AD 1 to AD4 and the chip enabling signals CE 1 to CE4. The output enabling signal OE and the chip enabling signal CE are inputted into the control circuit 40.

Thereafter, the control circuit 40 applies the control signal to the X-address buffer/decoder 50, the Y-address buffer/decoder 60, the sense amplifying circuit 60 and the data output buffer/driver 90, respectively.

If the user is an unauthorized user who inputs the incorrect chip enabling signal, the switching unit 20 outputs a low signal as described above. The first transfer gate 32 is turned on by the low output signal of the switching circuit 20 and the second transfer gate 33 is turned off by the low output signal of the switching circuit 20. The first transfer gate 32 applies the output of the exclusive Or-gate 31 to the X-, Y-address buffer/decoders 50 and 60, respectively. Accordingly, incorrect address signals, ADD1–ADD4 are provided to the X-, Y-address buffers/decorder 50 and 60.

If the user is an authorized personnel who inputs the programmed chip enabling signals, the switching unit 20 outputs a high signal to the converting units 30-1 to 30-4. The first transfer gate 32 is turned off by the high output signal of the switching circuit 20 and the second transfer gate 33 is turned on by the high output signal of the switching circuit 20, the second transfer gate 33 applies the address signals AD1-AD4 to the X-, Y-address buffer/decoders 50 and 60, respectively as the converted address signals ADD 1 to ADD4. Accordingly, the correct address signals ADD1–ADD4 are provided to the X-, Y-address buffers/decoders.

Thereafter, the X-address buffer/decoder 50 and the Y-address buffer/decoder 60 buffer the converted address data of the data converting circuits 30-1~30-m in accordance with a control signal applied thereto and decode the buffed data and applies the decoded data to the data storing circuit 70.

The data storing circuit 70 selects the signals outputted from the X-, Y-address buffer/decoders 50 and 60 and outputs the selected data to the sense amplifying circuit 80.

The sense amplifying circuit 80 amplifies the data outputted from the data storing circuit 70 in accordance with a control signal of the control circuit 40 and outputs the amplified data to the data output buffer/driver 90.

The data output buffer/driver 90 buffers the data outputted from the sense amplifying circuit 80 in accordance with a control signal outputted from the control circuit 40 and outputs the buffered data to the output terminal OUT.

After a user stores the security data into each cell of the security data storing circuit, even if the user designates an address corresponding to the data stored therein in order to illegally copy the data, the desired data cannot be copied.

An improved copy protection circuit of a data stored in a memory according to the present invention is capable of advantageously protecting against illegal copying of data stored in a memory such as mask ROM or a programmable ROM(Read Only Memory) by storing a data in a security data store cell.

For example, when the chip enabling signal CE1–CE4 are coded as 1,0,1,1", as described above, as the security data, the user must input the correct chip enabling signal CE1–CE4. If the user desires to access the data stored in the address "0,0,0,0" in the data storing unit 70, the user must input the chip enabling signal of "1,0,1,1" such that the converted address ADD1–ADD4 of "0,0,0,0" is output by the data converting circuit 30. If the wrong chip enabling signal CE1–CE4 is inputted by the unauthorized user, the first transmission gate 32 is turned on such that the data converting circuit 30 outputs the converted address ADD1–ADD4, which has been exclusively ORed the by exclusive OR-Rule gate in the data converting units, and undesired address is accessed in the data storing unit 70.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A copy protection circuit for a data in a memory, comprising:
   a security data store circuit for storing a security data encoded in accordance with a chip enabling signal applied thereto;
   a program circuit coupled to said security data store circuit to program said security data store circuit;
   a switch circuit for outputting a switching signal controlled by the security data inputted through said program circuit; and
   a data converting circuit for converting an input address by receiving the input address and the security data and for outputting one of a converted address and the input address to an X, Y-address buffer/decoder in accordance with an output of the switch circuit.

2. The circuit of claim 1, wherein said security data store circuit is a programmable ROM(Read Only Memory).

3. The circuit of claim 2, wherein said programmable ROM consists of a predetermined number of memory cells which is the same as the number of the input address.

4. The circuit of claim 3, wherein each of said memory cell includes a first transistor controlled in accordance with a chip enabling signal applied thereto, and a fuse connected to an output terminal the transistor and fused in accordance with a chip enabling signal applied thereto.

5. The circuit of claim 4, wherein said switch circuit includes a second transistor controlled in accordance with each security data and commonly connected with output terminals of the first transistor through the program circuit.

6. The circuit of claim 1, wherein said converted address is exclusively operated in response to an input address and a security data when an incorrect security data is inputted to said security data store circuit.

7. The circuit of claim 1, wherein said data converting circuit includes a transfer cable for transferring the converted address and the input address in accordance with an output of the switch circuit.

* * * * *